(12) United States Patent
Nayfeh et al.

(10) Patent No.: US 6,992,298 B2
(45) Date of Patent: Jan. 31, 2006

(54) COATED SPHERICAL SILICON NANOPARTICLE THIN FILM UV DETECTOR WITH UV RESPONSE AND METHOD OF MAKING

(75) Inventors: Munir H. Nayfeh, Urbana, IL (US); Osama M. Nayfeh, Cambridge, MA (US)

(73) Assignee: The Board of Trustees of the University of Illinois, Urbana, IL (US)

( * ) Notice: Subject to any disclaimer, the term of this patent is extended or adjusted under 35 U.S.C. 154(b) by 93 days.

(21) Appl. No.: 10/374,683

(22) Filed: Feb. 25, 2003

(65) Prior Publication Data

US 2003/0178571 A1    Sep. 25, 2003

Related U.S. Application Data

(63) Continuation-in-part of application No. 09/990,250, filed on Nov. 21, 2001, now Pat. No. 6,743,406.

(51) Int. Cl.
| | | |
|---|---|---|
| G01J 1/42 | (2006.01) | |
| H01L 21/00 | (2006.01) | |
| H01L 27/14 | (2006.01) | |
| H01L 31/00 | (2006.01) | |

(52) U.S. Cl. .................. 250/372; 438/63; 257/431
(58) Field of Classification Search ................ 250/372, 250/395, 336.1, 365; 438/63; 427/67, 74
See application file for complete search history.

(56) References Cited

U.S. PATENT DOCUMENTS

| 3,597,624 A | 8/1971 | Weiner ............................ 372/3 |
| 3,786,321 A * | 1/1974 | Mathews ....................... 257/431 |
| 4,931,692 A | 6/1990 | Takagi et al. ................. 313/503 |
| 5,308,804 A | 5/1994 | Lee .............................. 501/17 |
| 5,336,547 A * | 8/1994 | Kawakita et al. ............ 428/209 |
| 5,527,386 A | 6/1996 | Statz ........................... 106/481 |
| 5,537,000 A | 7/1996 | Alivisatos et al. ........... 313/506 |
| 5,561,679 A | 10/1996 | Mannik et al. ................ 372/43 |
| 5,690,807 A | 11/1997 | Clark, Jr. et al. ............ 205/655 |
| 5,695,617 A | 12/1997 | Graiver et al. .......... 204/157.14 |
| 5,703,896 A | 12/1997 | Pankove et al. ............... 372/50 |
| 5,714,766 A | 2/1998 | Chen et al. .................... 257/17 |
| 5,747,180 A | 5/1998 | Miller et al. ................. 428/601 |
| 5,770,022 A | 6/1998 | Chang et al. ................ 204/164 |
| 5,881,200 A | 3/1999 | Burt ............................ 385/142 |

(Continued)

FOREIGN PATENT DOCUMENTS

EP          0 354 141          2/1990

(Continued)

OTHER PUBLICATIONS

G. Allan, C. Delerue, M. Lannoo, "Nature of Luminescent Surface States of Semiconductor Nanocrystallites", Physical Rev. Lett., vol. 76, No. 16, Apr. 15, 1996, pp. 2961-2964.

(Continued)

*Primary Examiner*—David Porta
*Assistant Examiner*—Frederick Rosenberger
(74) *Attorney, Agent, or Firm*—Greer, Burns & Crain, Ltd.

(57) ABSTRACT

A UV detector has a UV detection thin film of coated spherical silicon nanoparticles formed upon a substrate. The detector includes structures to bias the thin film. In preferred embodiments, a thin conductor that is at least semi-transparent to UV radiation is formed over the thin film. In preferred embodiments, the UV detector is formed as a silicon based integration, upon a device quality silicon wafer.

15 Claims, 4 Drawing Sheets

U.S. PATENT DOCUMENTS

| | | | |
|---|---|---|---|
| 5,891,548 A | 4/1999 | Graiver et al. | 428/98 |
| 5,906,670 A | 5/1999 | Dobson et al. | 75/370 |
| 5,932,889 A | 8/1999 | Matsumura et al. | 257/14 |
| 5,939,206 A * | 8/1999 | Kneezel et al. | 428/480 |
| 5,942,748 A | 8/1999 | Russell et al. | 250/214.1 |
| 6,060,743 A | 5/2000 | Sugiyama et al. | 257/321 |
| 6,239,453 B1 * | 5/2001 | Yamada et al. | 257/79 |
| 6,326,311 B1 | 12/2001 | Ueda et al. | 438/694 |
| 6,407,424 B2 | 6/2002 | Forbes | 257/315 |
| 6,479,825 B1 * | 11/2002 | Weiss | 250/370.02 |
| 2002/0074565 A1 * | 6/2002 | Flagan et al. | 257/200 |

FOREIGN PATENT DOCUMENTS

| | | | |
|---|---|---|---|
| JP | 05129648 A | * | 5/1993 |

OTHER PUBLICATIONS

D. Andsager, J. Hilliard, J.M. Hetrick, L.H. AbuHassan, M. Plisch, M.H. Nayfeh, "Quenching of Porous Silicon Photoluminescence by Deposition of Metal Adsorbates", J. Appl. Phys., vol. 74, No. 7, Oct. 1, 1993, pp. 4783-4785.

D. Andsager, J. Hilliard, M.H. Nayfeh, "Behavior of Porous Silicon Emission Spectra During Quenching by Immersion in Metal Ion Solutions", Appl. Phys. Lett., vol. 64, No. 9, Feb. 28, 1994, pp. 1141-1143.

D. Andsager, J.M. Hetrick, J. Hilliard, M.H. Nayfeh, "Diffusion of Copper in Porous Silicon", J. Appl. Phys., vol. 77, No. 9, May 1, 1995, pp. 1-4.

Anton Fojtik, Amim Henglein, "Luminescent colloidal silicon particles", Chemical Physics Letters 221, Apr. 29, 1994, pp. 363-367.

Gennadiy Belomoin, Joel Therrien, and Munir Nayfeh, "Oxide and hydrogen capped ultrasmall blue luminescent Si nanoparticles", Applied Physics Letters, vol. 77, No. 6, Aug. 7, 2000, pp. 779-780.

M.L. Brongersma, K.S. Min, E. Boer, T.Tambo, A. Polman, and H.A. Atwater, "Tailoring the Optical Properties of Si Nanocrystals in $SiO_2$ Materials Issues and Nanocrystal Laser Perspectives", Mat. Res. Soc. Symp. Proc., vol. 486, 1998 Materials Research Society, pp. 213-217.

L.E. Brus, P.F. Szajowski, W.L. Wilson, T.D. Harris, S. Schuppler, and P.H. Citrin, "Electronic Spectroscopy and Photophysics of Si Nanocrystals: Relationship to Bulk c-Si and Porous Si", J. Am. Chem. Soc., 1995, vol. 117, pp. 2915-2922.

L.T. Canham, "Silicon Quantum Wire Array Fabrication by Electrochemical and Chemical Dissolution of Wafers", Appl. Phys. Lett., vol. 57, No. 10, Sep. 3, 1990, pp. 1046-1048.

R.P. Chin, Y.R. Shen, V. Petrova-Koch, "Photoluminescence from Porous Silicon by Infrared Multiphoton Excitation" Science, vol. 270, Nov. 3, 1995, pp. 776-778.

S. Li, S.J. Silvers, M.S. El Shall, Luminescence Properties of Silicon Nanocrystals, Advances in Microcrystalline and Nanocrystalline Semiconductor Symposium, Boston, MA, USA, Dec. 2-6, 1996 (abstract).

G.M. Credo, M.D. Mason, and S.K. Buratto, "External quantum efficiency of single porous silicon nanoparticles", Applied Physics Letters, vol. 74, No. 14, Apr. 5, 1999, pp. 1978-1980.

A.G. Cullis, L.T. Canham, P.D.J. Calcott, "The Structural and Luminescence Properties of Porous Silicon", J. Appl. Phys., vol. 82, No. 3, Aug. 1, 1997, pp. 909-965.

D.J. DiMaria, J.R. Kirtley, E.J. Pakulis, D.W. Dong, T.S. Kuan, F.L. Pesavento, T.N. Theis, J.A. Cutro, and S.D. Brorson, "Electroluminescence studies in silicon dioxide films containing tiny silicon islands", J. Appl. Phys., vol. 56, No. 2, Jul. 15, 1984, pp. 401-416.

J. Erland, P. Yu, S.I. Bozhevolnyl, J.M. Hvam, N.N. Ledentsov, "Second harmonic spectroscopy of semiconductor nanostructures", Quantum Electronics and Laser Science Conference Technical Digest, May 1999, pp. 233-234.

F. Koch, "Models and Mechanisms for the Luminescence of Porous Si", Mater. Res. Soc. Symp. Proc., vol. 298, 1993, pp. 319-329.

J. Gole, D. Dixon, "Evidence for Oxide Formation from the Single and Multiphoton Excitation of a Porous Silicon Surface or Silicon 'Nanoparticles'", J. Appl. Phys., vol. 83, No. 11, Jun. 1, 1998, pp. 5985-5991.

E. Hanamura, "Very Large Optical Nonlinearity of Semiconductor Microcrystallites", Physical Rev. B, vol. 37, No. 3, Jan. 15, 1988, pp. 1273-1279.

J.L. Heinrich, C.L. Curtis, G.M. Credo, K.L. Kavanagh, M.J. Sailor, "Luminescent Colloidal Silicon Suspensions from Porous Silicon", Science, vol. 255, Jan. 3, 1992, pp. 66-68.

J. Hilliard, D. Andsager, L. Abu Hassan, H.M. Nayfeh, M.H. Nayfeh, "Infrared Spectroscopy and Secondary Ion Mass Spectrometry of Luminescent, Nonluminescent and Metal Quenched Porous Silicon", J. Appl. Phys., vol. 76, No. 4, Aug. 15, 1994, pp. 2423-2427.

J.E. Hilliard, H.M. Nayfeh, M.H. Nayfeh, "Re-Establishment of Photoluminescence in Cu Quenched Porous Silicon by Acid Treatment", J. App. Phys., vol. 77, No. 8, Apr. 15, 1995, pp. 4130-4132.

Kouichi Murakami and Tetsuya Makimura, Silicon nanoparticles with visible light emission -Laser ablation-, Oyo Buturi, vol. 67, No. 7, pp. 817-821, Jul. 1998 (with verified translation).

K.A. Littau, P.J. Szajowski, A.J. Muller, A.R. Kortan, and L.E. Brus, "A Luminescent Silicon Nanocrystal Colloid via a High-Temperature Aerosol Reaction", The Journal of Physical Chemistry, vol. 97, No. 6, 1993, pp. 1224-1230.

L.A. Chiu, A.A. Seraphin, and K.D. Kolenbrander, "Gas Phase Synthesis and Processing of Silicon Nanocrystallites: Characterization by Photoluminescence Emission Spectroscopy", Journal of Electronic Materials, vol. 23, No. 3, 1994, pp. 347-354.

Tetsuya Makimura, Yasuhiko Kunii and Kouichi Murakami, "Light Emission from Nanometer-Sized Silicon Particles Fabricated by the Laser Ablation Method", Jpn. J. Appl. Phys., vol. 35, (1996), pp. 4780-4784.

M. Nayfeh, "Fabrication of Nanometer Scale Structures", SPIE Institutes, vol. IS 10, (1993), pp. 200-217.

M.H. Nayfeh, N. Rigakis, Z. Yamani, "Photoexcitation of Si-Si Surface States in Nanocrystallites", Physical Review B, vol. 56, No. 4, Jul. 15, 1997, pp. 2079-2084.

M.H. Nayfeh, N. Rigakis, Z. Yamani, "Photoexcitation of Si-Si Radiative Surface States in Nanocrystallites", Mat. Res. Soc. Symp. Proc., vol. 486, 1998, pp. 243-248.

M.H. Nayfeh, Z. Yamani, O. Gurdal, A. Alaql, "Nanostructure of Porous Silicon Using Transmission Microscopy", Mat. Res. Soc. Symp. Proc., vol. 536, 1999.

M. Nayfeh, O. Akcakir, J. Therrien, Z. Yamani, N. Barry, W. Yu, and E. Gratton, "Highly nonlinear photoluminescence threshold in porous silicon", Applied Physics Letters, vol. 75, No. 26, Dec. 27, 1999, pp. 4112-4113.

U. Neuwald, A. Feltz, U. Memmert, R.J. Behm, "Chemical Oxidation of Hydrogen Passivated Si(111) Surface in $H_2O_2$", J. Appl. Phys., vol. 78, No. 6, Sep. 15, 1995, pp. 4131-4136.

A. Pasquarello, M.S. Hybertsen, R. Car, "Si 2p Core-Level Shifts at the Si(001)—SiO$_2$ Interface: A First-Principles Study", Phys. Rev. Lett., vol. 74, No. 6, Feb. 6, 1995, pp. 1024-1027.

L. Pavesl, L. Dal Negro, C. Mazzoleni, G. Franzo and F. Prlolo, "Optical gain in silicon nanocrystals", Nature, vol. 408, Nov. 23, 2000, pp. 440-443.

S.I. Raider, R. Flitsch, M.J. Palmer, "Oxide Growth on Etched Silicon in Air at Room Temperature", J. Electrochem. Soc., vol. 122, No. 3, Mar. 1975, pp. 413-418.

N. Rigakis, J. Hilliard, L. Abu Hassan, J. Hetrick, D. Andsager, M.H. Nayfeh, "Effect of Oxidation Treatments on Photoluminescence Excitation of Porous Silicon", J. App. Phys., vol. 81, No. 1, Jan. 1, 1997, pp. 440-444.

N. Rigakis, Z. Yamani, L. Abu Hassan, J. Hilliard, M.H. Nayfeh, "Time-Resolved Measurements of the Photoluminescence of Cu-Quenched Porous Silicon", Appl. Phys. Lett., vol. 69, 1996, pp. 2216-2218.

S. Juen, K. Überbacher, J. Baldauf, K.F. Lamprecht, R. Tessadri, R. Lackner, R.A. Höpfel, "Technology and Photoluminescence of GaAs Micro- and Nanocrystallites", Superlattices and Microstructures, vol. 11, No. 2, 1992, pp. 181-184.

Shoutian Li, I.N. Germanenko, M.S. El Shall, "Semiconductor nanoparticles in contact: quenching of the photoluminescence from silicon nanocrystals by WO3 nanoparticles suspended in solution", Journal of Physical Chemistry B, vol. 102, No. 38, pp. 7319-7322, Sep. 17, 1998 (Abstract).

Shoutian Li, Stuart J. Silvers and M. Samy El-Shall, Luminescence Properties of Silicon Nanocrystals, Material Research Society Symposium Proceedings, vol. 452, 1997, pp. 141-146.

W.H. Thompson, Z. Yamani, L.H. Abu Hassan, J.E. Greene, M. Nayfeh, M.A. Hasan, "Room Temperature Oxidation Enhancement of Porous Si(001) Using Ultraviolet-Ozone Exposure", J. Appl. Phys., vol. 80, No. 9, Nov. 1, 1996, pp. 5415-5421.

W.H. Thompson, Z. Yamani, L. Abu Hassan, O. Gurdal, M. Nayfeh, "The Effect of Ultrathin Oxides on Luminescent Silicon Nanocrystallites", Appl. Phys. Lett., vol. 73, No. 6, Aug. 10, 1998, pp. 841-843.

Sandip Tiwari, Farhan Rana, Hussein Hanafi, Allan Hartstein, Emmanuel F. Crabbé, and Kevin Chan, "A silicon nanocrystals based memory", Appl. Phys. Lett., vol. 68, No. 10, Mar. 4, 1996, pp. 1377-1379.

J. Wang, H.B. Jiang, W.C. Wang, J.B. Zheng, F.L. Zhang, P.H. Hao, X.Y Hou, X. Wang, "Efficient Infrared-Up-Conversion Luminescence in Porous Silicon: A Quantum-Confinement-Induced Effect", Phys. Rev. Lett., vol. 69, No. 22, Nov. 30, 1992, pp. 3252-3255.

E. Werwa, A.A. Seraphin and K.D. Kolenbrander, Excitation Intensity and Temperature Dependent Photoluminescence Behavior of Silicon Nanoparticles, Material Research Society Symposium Proceedings, vol. 452, 1997, pp. 129-134.

Z. Yamani, W.H. Thompson, L. Abu Hassan, M.H. Nayfeh, "Ideal Anodization of Silicon", Appl. Phys. Lett., vol. 70, No. 25, Jun. 23, 1997, pp. 3404-3406.

Z. Yamani, S. Ashhab, A. Nayfeh, W.H. Thompson, M. Nayfeh, "Red to Green Rainbow Photoluminescence from Unoxidized Silicon Nanocrystallites", J. Appl. Phys., vol. 83, No. 7, Apr. 1, 1998, pp. 3929-3931.

Z. Yamani, N. Rigakis, M.H. Nayfeh, "Excitation of Size Selected Nanocrystallites in Porous Silicon", Appl. Phys. Lett., vol. 72, No. 20, May 18, 1998, pp. 2556-2558.

Z. Yamani, A. Alaql,J. Therrien, O. Nayfeh, M. Nayfeh, "Revival of Interband Crystalline Reflectance from Nanocrystallites in Porous Silicon by Immersion Plating", Appl. Phys. Lett., vol. 74, No. 23, Jun. 7, 1999, pp. 3483-3485.

Z. Yamani, O. Gurdal, A. Alaql, M.H. Nayfeh, "Correlation of Diffuse Scattering with Nanocrystallite Size in Porous Silicon Using Transmission Microscopy", J. Appl. Phys., vol. 85, No. 12, Jun. 15, 1999, pp. 8050-8053.

S. T. Yau, D. Saltz, M. H. Nayfeh, "Laser-Assisted Deposition of Nanometer Structures Using a Scanning Tunneling Microscope", Appl. Phys. Lett., vol. 57, No. 27, Dec. 31, 1990, pp. 2913-2915.

S.T. Yau, X. Zheng, M.H. Nayfeh, "Nanolithography of Chemically Prepared Si With a Scanning Tunneling Microscope", Appl. Phys. Lett., vol. 59, No. 19, Nov. 4, 1991, pp. 2457-2459.

Xinwei Zhao, Olaf Schoenfeld, Jun-ichi Kusano, Yoshinobu Aoyagi and Takuo Sugano, "Observation of Direct Transitions in Silicon Nanocrystallites", Jpn. J. Appl. Phys., vol. 33, Jul. 1, 1994, Pt. 2, No. 7A, pp. L899-L901.

U.S. Appl. No. 09/426,204, Nayfeh et al., entitled Silicon Nanoparticle Stimulated Emission Devices, filed Oct. 25, 1999; and.

U.S. Appl. No. 09/426,389, Nayfeh et al., entitled Silicon Nanoparticle and Method for Producing the Same filed Oct. 22, 1999; and.

U.S. Appl. No. 09/496,506, Nayfeh et al., entitled Silicon Nanoparticle Field Effect Transistor and Transistor Memory Device, filed Feb. 2, 2000; and.

U.S. Appl. No. 09/572,121, Nayfeh et al., entitled Silicon Nanoparticle Microcrystal Nonlinear Optical Devices, filed May 17, 2000; and.

U.S. Appl. No. 09/781,147, Nayfeh et al., entitled Silicon Nanoparticle Electronic Switches, filed Feb. 9, 2001; and.

U.S. Appl. No. 09/990,250, Nayfeh et al., entitled Family of Discretely Sized Silicon Nanoparticles and Method for Producing the Same, filed Nov. 21, 2001; and.

U.S. Appl. No. 10/361,176, Nayfeh et al., entitled Silicon Nanoparticle and Method for Producing the Same, filed Oct. 22, 1999.

Fujii, M., Hayashi, S. Yamamoto, K., "Photoluminescence from B-Doped Si Nanocrystals," Journal of Applied Physics, American Institute of Physics, New York, vol. 83, No. 12, Jun. 15, 1998, pp. 7953-7957.

Levoska, J., Tyunina, M., Leppävuori, S., "Laser Ablation Deposition of Silicon Nanostructures," NanoStructured Materials, Elsevier, New York, Published Online Oct. 6, 1999, pp. 101-106.

Brus, L., "Luminescence of Silicon Nanocrystals and Porous Silicon," Japanese Journal of Applied Physics, Publication Office Japanese Journal of Applied Physics, Tokyo, JP, vol. 34, No. 34-1, Suppl., Jan. 1994, pp. 5-7.

* cited by examiner

COATED SPHERICAL SILICON NANOPARTICLE THIN FILM UV DETECTOR WITH UV RESPONSE AND METHOD OF MAKING

RELATED APPLICATION AND PRIORITY CLAIMED

This application is a continuation-in-part of application Ser. No. 09/990,250, filed Nov. 21, 2001, now U.S. Pat. No. 6,743,406 entitled "Family of Discretely Sized Silicon Nanoparticles and Method for Producing the Same". Priority is claimed under 35 U.S.C. § 120.

STATEMENT OF GOVERNMENT INTEREST

This invention was made with Government assistance under NSF Grant No. BES-0118053. The Government has certain rights in this invention.

FIELD OF THE INVENTION

A field of the invention is UV radiation detection.

BACKGROUND OF THE INVENTION

Detection of ultraviolet (UV) radiation is an important feature for many applications. Sensitive UV light detection may find applications as diverse as military, security, commercial, and consumer applications.

UV detection may make use of the photoelectric effect of metal and the gas multiplication effect. Many commercial UV detectors take the form of gas tubes. These are unsuitable in many cases due to slow response time, size constraints, and due to the demanding environments in which UV detectors, in some cases, may find utility. Semiconductor UV detectors have been developed in response to these problems. The semiconductor UV detectors are resilient and compact. Known commercial UV semiconductor detectors are formed from wide bandgap semiconductors.

Wide bandgap semiconductors used in conventional UV detectors include metal zinc oxide (ZnO) and magnesium zinc oxide (MgZnO). There are also Schottky-type $TiO_2$ UV-photodetectors. Familiar III-V materials used in UV detectors include GaAs, GaP, and ternary AlGaAs and InGaAs. A distinctive aspect of Group III-nitrides is that their bandgaps are tunable within the energy range that corresponds to blue and ultraviolet wavelengths. Other approaches for UV detection include organics and phosphors.

Silicon based UV detection utilizes amorphous silicon alloys and silicon carbide material. Elemental silicon is not generally useful for UV detection because it has a bandgap of 1.1 eV, corresponding to an infrared wavelength of 1.1 $\mu$m. Si is accordingly not fit for UV detection, necessitating the use of other materials, such as nitride-based heterostructures grown on incompatible substrates, namely Si and Ge. Fabrication on Si leads to a large number of defects, which can impact device sensitivity and general performance. There is accordingly a need for an efficient UV detector that is compatible with pervasive silicon-based integrated circuit technology.

SUMMARY OF THE INVENTION

A UV detector has a UV detection thin film of coated spherical silicon nanoparticles formed upon a substrate. The spherical silicon nanoparticles in a UV detection film of the invention have sizes selected from the group of 1 nm, 1.67nm, 2.15 nm 2.9 nm and 3.7 nm. The coating can determine wavelength sensitivity. The detector includes structures to bias the thin film. A thin conductor that is at least semi-transparent to UV radiation is formed over the UV detection thin film. In preferred embodiments, the UV detector is formed as a silicon based integration, upon a device quality silicon wafer.

DETAILED DESCRIPTION OF THE PREFERRED EMBODIMENTS

Figure 1:
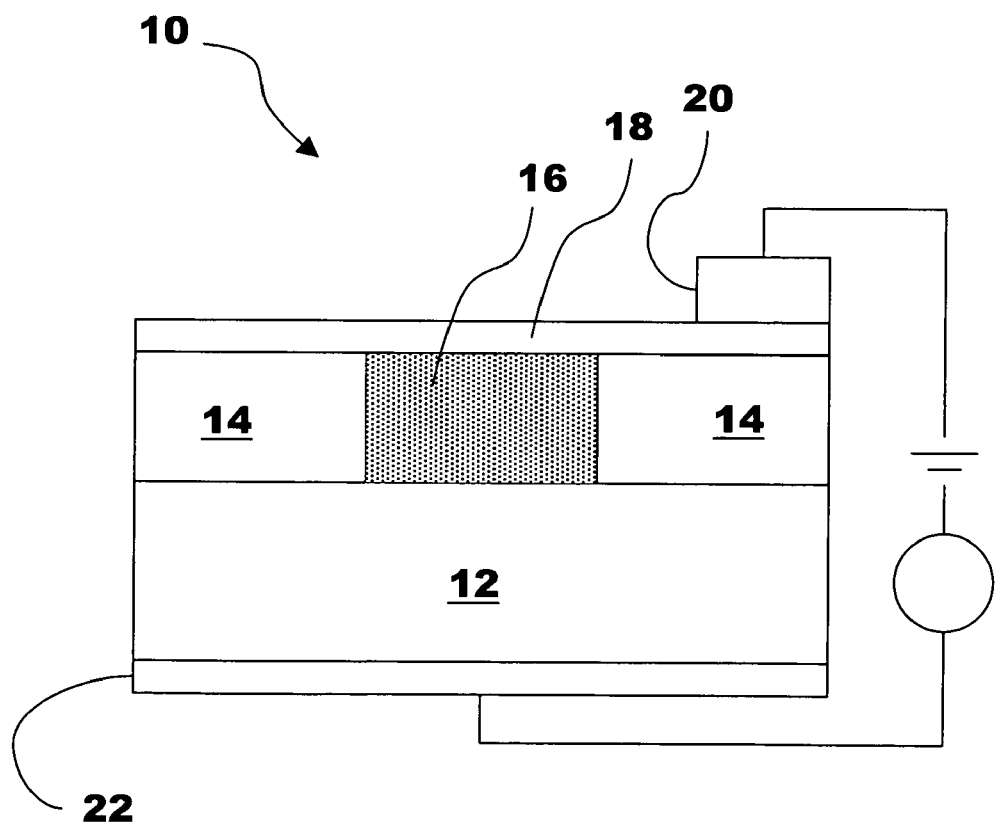
FIG. 1 is a schematic cross-section of a preferred embodiment coated spherical silicon nanoparticle thin film UV detector.

The invention will be illustrated with respect to preferred embodiment devices. In general, UV detection films of the invention may find use in various semiconductor device structures. These include various detector structures, e.g. photodetectors, and also the incorporation of detector structures of the invention into device integrations.

The invention provides a stable and high performance silicon based UV light detector. A detector of the invention exhibits photostablity. Detectors of the invention may be produced with an arbitrarily large active area, e.g., 1 $cm^2$, as the physical nature of the stable UV detection films of the invention does not limit the active area size. Methods of forming detectors of the invention do not require lithographic or epitaxial techniques to form the coated spherical silicon nanoparticle UV sensitive thin film. This is a manufacturing advantage and makes devices of the invention amenable to large-volume production and wide scale integration.

In preferred embodiments, a coated spherical silicon nanoparticle film forms an active detection region, which is defined by a patterned oxide layer formed upon a silicon substrate. The UV detection film in the active detection region is made of coated silicon nanoparticles that are spherically shaped. The spherical silicon nanoparticles are of a size selected from the group consisting of 1 nm, 1.67 nm, 2.15, 2.9 and 3.7 nm. Sizes are measured sizes. Taking the example of the 1 nm size, computations indicate an individual 1 nm particle consists of ~29 silicon atoms, with a possible range of 28–32 silicon atoms. An exemplary coating is hydrogen. Taking the example of the 1 nm size, computations indicate the atomic count of hydrogen atoms to be ~24 hydrogen atoms. A thin contact layer is formed over the active region. Device contacts are made to the thin contact layer and the substrate. A method for forming devices of the invention includes forming a patterned oxide on a silicon substrate. A thin film of coated spherical silicon nanoparticles is deposited from a colloid into the defined areas.

UV detectors of the invention are suitable for many uses. Detection in the UV portion of the spectrum has military functions, including airborne missile warning systems and detection of biological agents in air. Commercial applications include flame detectors in industrial equipment, detectors in jet engine applications, and consumer detectors for UV dosing. UV detection serves scientific investigation of the atmosphere and the study of space. UV detection can be used in industrial equipment as part of a warning system or a combustion monitor. UV detectors can be used as a fire alarm. They also find application in chromatography.

A high sensitivity level at wavelengths below 300 nm results in an extremely low rate of false alarm in detectors of the invention that usually plagues heat (infrared) detectors. Detection of invisible discharge phenomena, such as corona discharges of high voltage transmission lines and arcs, inspection of ultraviolet leakage, monitoring UV curing and drying, controlling UV sterilization, and monitoring UV exposure in phototherapy are also applications in which detectors of the invention are useful. Furthermore, unlike the active nature of a radar system, passive UV detection technology makes surveillance truly invisible.

In describing the invention, particular exemplary devices, formation processes, and device applications will be used for purposes of illustration. Dimensions and illustrated devices may be exaggerated for purposes of illustration and understanding of the invention. The elements of the drawings are not to scale relative to each other. A device illustrated in conventional fashion by a two-dimensional schematic layer structure will be understood by artisans to provide teaching of three-dimensional device structures and integrations.

Referring now to FIG. 1, a preferred embodiment coated spherical silicon nanoparticle thin film UV detector 10 is shown. The detector 10 is a silicon-based integration, with a substrate 12 preferably comprising silicon, e.g., a p-type doped silicon wafer. A dielectric layer 14, e.g., a thermal oxide, silicon dioxide, etc., serves to isolate active UV detection regions 16 from each other. One UV detection region 16 is shown, but artisans will appreciate that arrays of detectors 10 and circuits including other electronic devices and one or more detectors 10 may be readily formed. The UV detection regions 16 are formed from thin films of coated spherical silicon nanoparticles. The size distribution in the film 16 does not include indiscriminate sizes. Rather, coated silicon nanoparticles in the thin film 16 are spherically shaped and of a size selected from the group consisting of 1 nm, 1.67 nm, 2.9 nm and 3.7 nm. The thin film may include identical particles of one of the sizes, or a mixture of the sizes.

A thin conductive and semi-transparent film 18 makes electrical contact to one or more detection regions 16 and permits UV radiation to pass and affect the detection regions 16. Thin, as used with respect to the film 18, means that it is thin enough to pass at least some UV radiation to the detection region(s) 16, i.e., it is thin enough to be semi-transparent to UV radiation. The maximum thickness of the film 18 will depend upon the material selected for the film, as the thickness point at which the film will completely block UW radiation depends upon the material selected for the film. Metals such as gold, aluminum, platinum and indium tin oxide (ITO) may be used.

Device contacts 20 are made to the detection regions 16 though the thin film 18. In preferred embodiments, the device contacts 20 form part of a circuit interconnect pattern. Contacts may be formed in multiple patterns and layers separated by dielectrics to form the detector 10 in a wide-scale integration. FIG. 1 also illustrates a configuration for experimental testing of prototypes, where voltage was applied between a device contact 20 and a contact layer 22 formed on a backside of the substrate 12.

Taking the example of preferred coated spherical 1 nm silicon, nanoparticle thin films forming the UV detection regions 16 have multiple energy gaps extending into the UV region, including energy gaps of 3.5 eV, 4.1 eV, and 4.5 eV, and matching UV photon energies, attributable to the coated spherical silicon nanoparticles formed into the UV detection thin film 16. The bandgap differs significantly from bulk silicon. The UV detection film 16 exhibits excellent sensitivity to UV light. The detector 10, fully constructed as a silicon-based integration, enables large area UV detectors with superior efficiency. In manufacture of the detector 10, the rejection ratios will be significantly smaller than those experienced in the nitride-silicon photodetector integrations. Full silicon-based integration compatibility is realized with the detector 10 of the invention.

The coated spherical silicon nanoparticle UV detection film 16 of the invention may be formed in a large area to increase sensitivity. The area of the UV detection film is not limited by the film properties. It is limited only by the area permitted for a detection region in a device integration.

Production of a device of the invention requires a colloid of coated dimensioned spherical nanoparticles selected from the group consisting of 1 nm, 1.67 nm, 2.15, 2.9 and 3.7 nm. A method for producing the same is disclosed in U.S. Published Application US-2002-0070121-A1 (Jun. 13, 2002), entitled "Family of Discretely Sized Silicon Nanoparticles and Method For Producing the Same", which is incorporated herein by reference.

Figure 2:
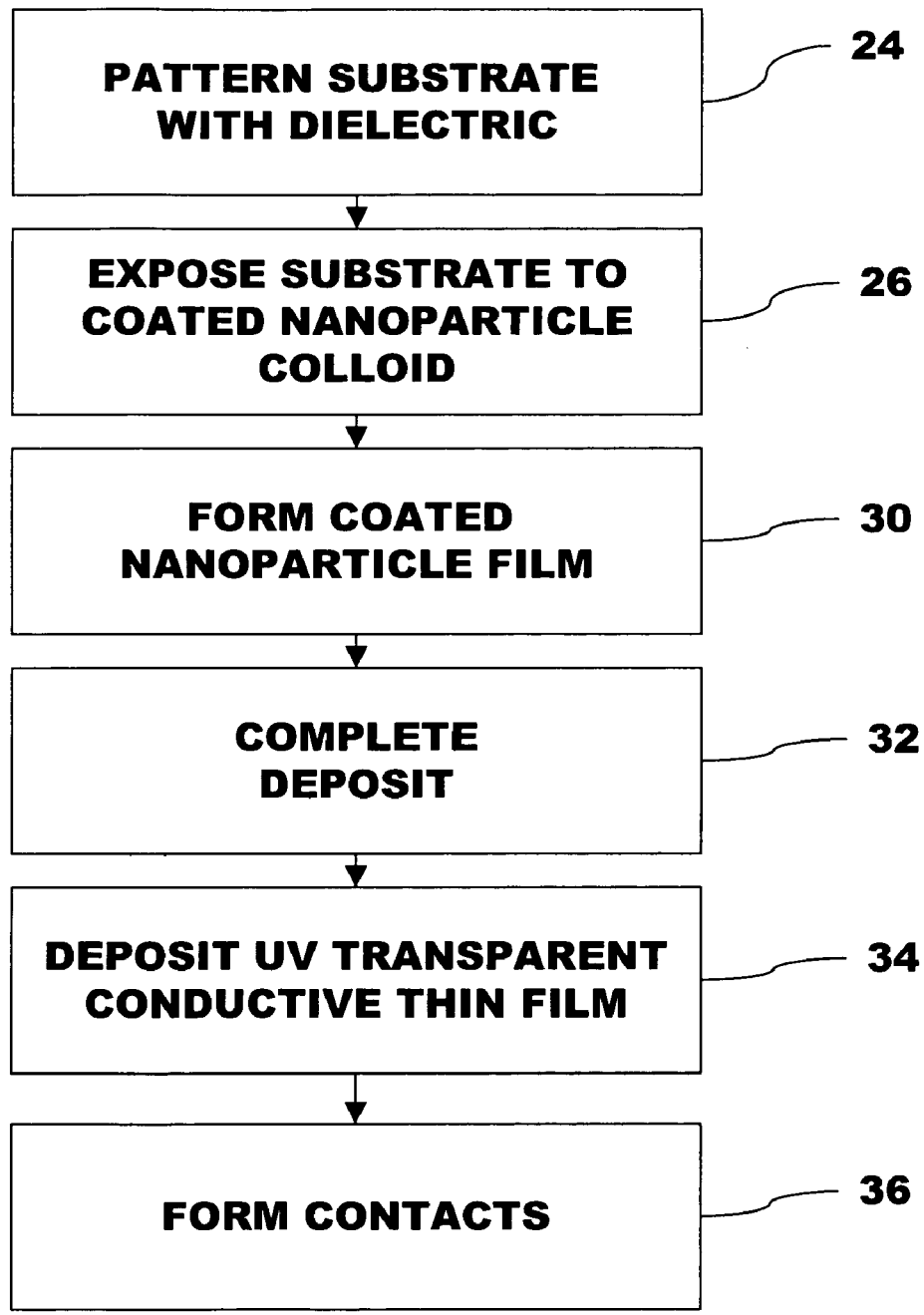
FIG. 2 is a block diagram of a preferred embodiment method for forming a coated spherical silicon nanoparticle thin film UV detector.

With reference to FIG. 2, a method of making a detector of the invention begins with the formation of a suitable dielectric patterning layer (step 24) on a silicon substrate, e.g., a p-type (100) device-quality silicon wafer. A conductive substrate, e.g., a metal substrate may be used instead of a silicon substrate. A thermal oxide layer is suitable for forming a dielectric pattern. The pattern can also serve as an isolation between devices. Other forms of patterning may also be used, including, for example, lithography and other procedures to create a mask pattern. The substrate including the mask pattern is then exposed to the silicon nanoparticle colloid. In a preferred example, the substrate is immersed or otherwise placed in a volume of a colloid of the particles, such as an alcohol colloid of coated spherical silicon nanoparticles (step 26). A deposit is then conducted (step 30). A preferred manner of deposition is an electrodeposition where the substrate is biased positively with respect to an immersed conductor, e.g., a platinum wire. A current flow is thereby established to continue deposition to form a thin film spherical silicon nanoparticles on the substrate. A current in the range of ~50–200 $\mu$A, for example, will cause coated spherical silicon nanoparticles from the colloid to deposit in the areas defined by the pattern. Other methods may be used to deposit the nanoparticles. For instance, it is possible to allow a simple evaporation of colloid to form a thin film of coated silicon nanoparticles.

In the case of electro-deposition, once a thin film of the coated nanoparticles has been formed, the substrate is then separated from the colloid (step 32). If the mask pattern does not also form the device dielectric, steps of removing the mask and forming isolation regions are conducted. A thin semitransparent conductive layer, e.g., gold, is deposited on the coated spherical silicon nanoparticle thin film regions (step 34). Device contacts are then formed (step 36).

Experimental versions of the embodiment shown schematically in FIG. 1 have been constructed with use of the preferred electro-deposition from colloids of hydrogen-coated 1 nm and 2.9 nm spherical silicon nanoparticles. The possible discrete sizes between the 1 nm and 2.9 nm spherical silicon nanoparticles are the 1.67 nm and 2.15 nm sizes, which will also be UV sensitive. The similar behavior of 3.7 nm sized particles through other properties indicates UV sensitivity by reference to the behavior of the 2.9 nm sized particles. An immersed platinum wire comprised the conductor to establish current flow. A current flow in the range 50–200 $\mu$A was established, depositing nanoparticles on the substrate in patterned thermal oxide. A semitransparent gold layer of 4 nm thickness was deposited on the formed coated spherical silicon nanoparticle thin films. Gold contact pads of 300 nm thickness were deposited on the thin gold top layer and on the back of the substrate, providing means to bias the device. Electrical connection was achieved by sandwiching the leads between indium wires and pressing against the pads until contact was established. Active coated spherical silicon nanoparticle thin films were tested having areas in the range of 25–50 mm$^2$.

Figure 3:
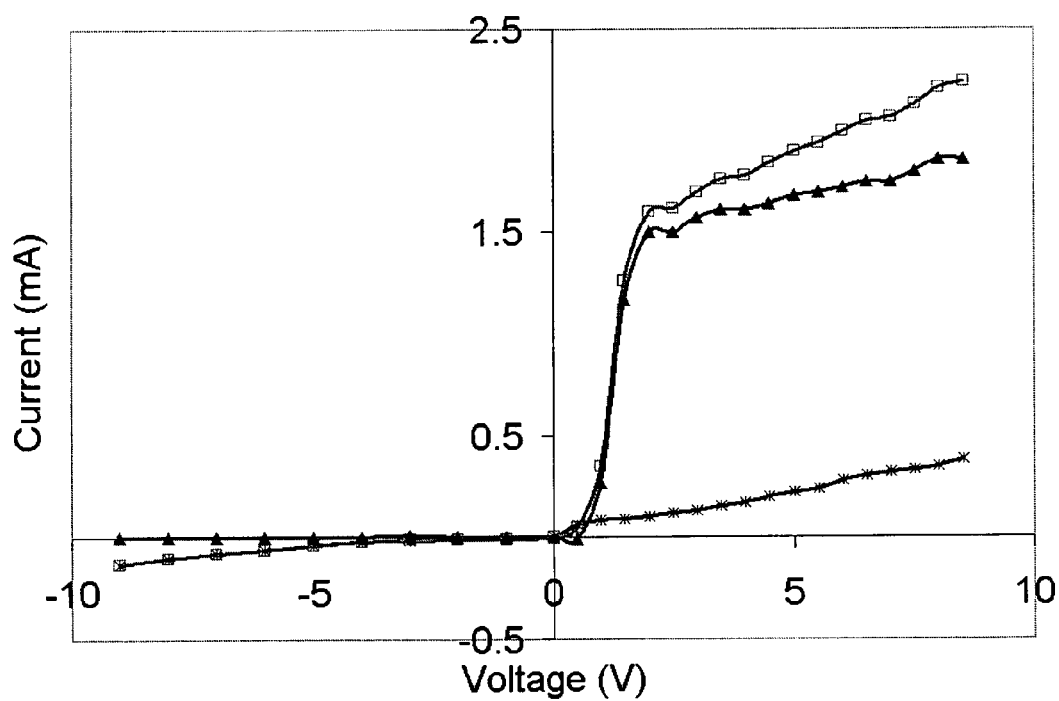
FIG. 3 is a data plot of the I-V characteristics of an experimental hydrogen coated spherical silicon nanoparticle thin film UV detector in linear scale taken under dark conditions and under illumination provided by 365 nm light from a mercury lamp, including a set of data points showing the difference between the dark and illuminated responses.

Experimental devices were tested utilizing radiation from an Hg lamp at powers of 1–15 mW. The points indicated by "*" in FIG. 3 show the I-V characteristics of a typical test detector in linear scale under dark conditions. The somewhat rectifying behavior indicates a p-type coated spherical silicon nanoparticle thin film layer and, consequently, a Schottky-like junction. The forward current, beginning to rise at 0.75 V, increases nonlinearly and saturates locally to 0.1 mA at 2 V. Beyond 2 V, the current rises linearly to 0.4 mA at 9 V, with an impedance of 21k$\Omega$. At 2 V, the forward current is 0.1 mA, while reverse current is 0.01 mA, giving a ratio of forward current to reverse current of 10. The points indicated by "□" in FIG. 3 show the I-V response of a typical test detector under illumination provided by a 365 nm light from a mercury lamp directed onto the detector. The I-V response now shows a very strong rectifying behavior. The forward current has been enhanced by a factor of 15, while the reverse current (under negative bias) is essentially unaffected. The forward current again begins to rise at 0.75 V, increasing nonlinearly but saturating locally to 1.6 mA at 2 V. Beyond 2 V, the current rises linearly to 2.25 mA at 8.5 V, with an impedance of 10k $\Omega$. The ratio of forward current to reverse current at 2 V is now 160. To isolate the effect of the UV light, the points indicated by "$\Delta$" show the difference in the data obtained with and without 365 nm light.

The operating wavelength range of the device may be tuned and controlled by changing the size of the nanoparticles used to construct the film. The size of the particles controls the band gap of the nanoparticle film, hence its UV response. Another means of tuning the operating wavelength is by controlling the nature of the coating on the nanoparticles. A nitrogen coating reduces the bandgap of the 1 nm diameter silicon nanoparticles by 0.25 electron volts, while a carbon coating increases the bandgap of the 1 nm diameter nanoparticles by 0.07 electron volts.

Experimental coated spherical silicon nanoparticle thin film detectors exhibited excellent spectral sensitivity. The spectral sensitivity is the product of the quantum efficiency for carrier generation and that of charge transport and collection. The nonlinearity and local plateau reflect space charge effects, including multiplication and saturation, under high charge densities and fields (~40 kV/cm). At 1 V. the sensitivity is ~150 mA/W, which is nearly an order of magnitude improvement over some commercial thin film detectors. With voltage, it rises to a local maximum of 750 mA/W at ~2V. Operation in the plateau ensures good stability and device operation. Device performance depends, among other factors, on the quality of the particle film (uniformity, thickness, packing). Other devices tested showed wider saturation regions (plateau), with softer rises. Spectral sensitivities ranging from 80 to 180 mA/W at 1V, and 350–750 mA/W at 2V have been measured for different depositions.

Recent research on SiC photodetectors has reported spectral sensitivities as high as 175 mA/W with quantum efficiency between 70 and 85%. However, SiC cannot be integrated on silicon due the large mismatch between its 3.1 Å lattice constant and the 5.44 Å lattice constant of silicon. Quantum efficiencies of up to 36% have been reported in amorphous silicon detectors. However, those also are incompatible with silicon based integrations.

Experimental devices of the invention also exhibited excellent visible blindness. At 390 nm, the sensitivity drops to 0.3 of that at 355 nm and drops to 0.036 at 560 nm. The response is excellent, matching that at 350 nm, for deeper UV of wavelengths as short as 240 nm. This indicates intrinsic visible blindness characteristic of a wide-bandgap semiconductor, i.e., there is a transparent window and a rejection of the visible light.

While the physical explanation of the films' performance is not necessary and does not affect the invention, by way of explanation the inventors believe UV radiation sensitivity and visible blindness of coated spherical silicon nanoparticle thin film UV detectors of the invention may be attributed to the electronic and optical properties of the coated spherical silicon nanoparticle thin films. The resistivity of the coated spherical silicon nanoparticle thin films is much greater than that of similarly doped, single-crystal Si. The large difference may be attributed to both electronic and geometrical effects. First, free carriers (either electrons or holes) are promoted to the conduction or valence band by substitution dopant atoms located within the particles, just as in single-crystal Si. However, under standard doping levels of ~10$^{15}$/ cm$^3$, dopant atoms or holes compare by a factor of about one in a million to silicon atoms, hence there are no empty levels for the injected electrons. Normal operational temperatures are not sufficient to induce holes. Second, material between particles, e.g., an oxide, creates potential barriers. For barriers of several tens of nanometers wide, carriers usually travel from one particle to another by thermionic excitation. For barriers of less than ~10 nm, tunneling can contribute substantially. The preferred electro-deposition method for depositing a thin film results in the close packing of coated spherical silicon nanoparticles in the thin film. Thus, electronic effects may be the dominant factor in charge carrier transport.

Applications of the UV detection coated spherical silicon nanoparticle thin films include the range of uses for conventional UV detectors. The UV sensitivity may be used as a filter for monitoring enzyme reactions, for example. The high efficiency allows the study of extremely small samples, assays in small volumes, and construction of a detector array for high speed screening. Significantly, the detectors of the invention are realized as a silicon based integration, with the entire detector structure being compatible with bulk silicon. Silicon based integrations including UV detectors of the invention may accordingly be realized.

Figure 4:
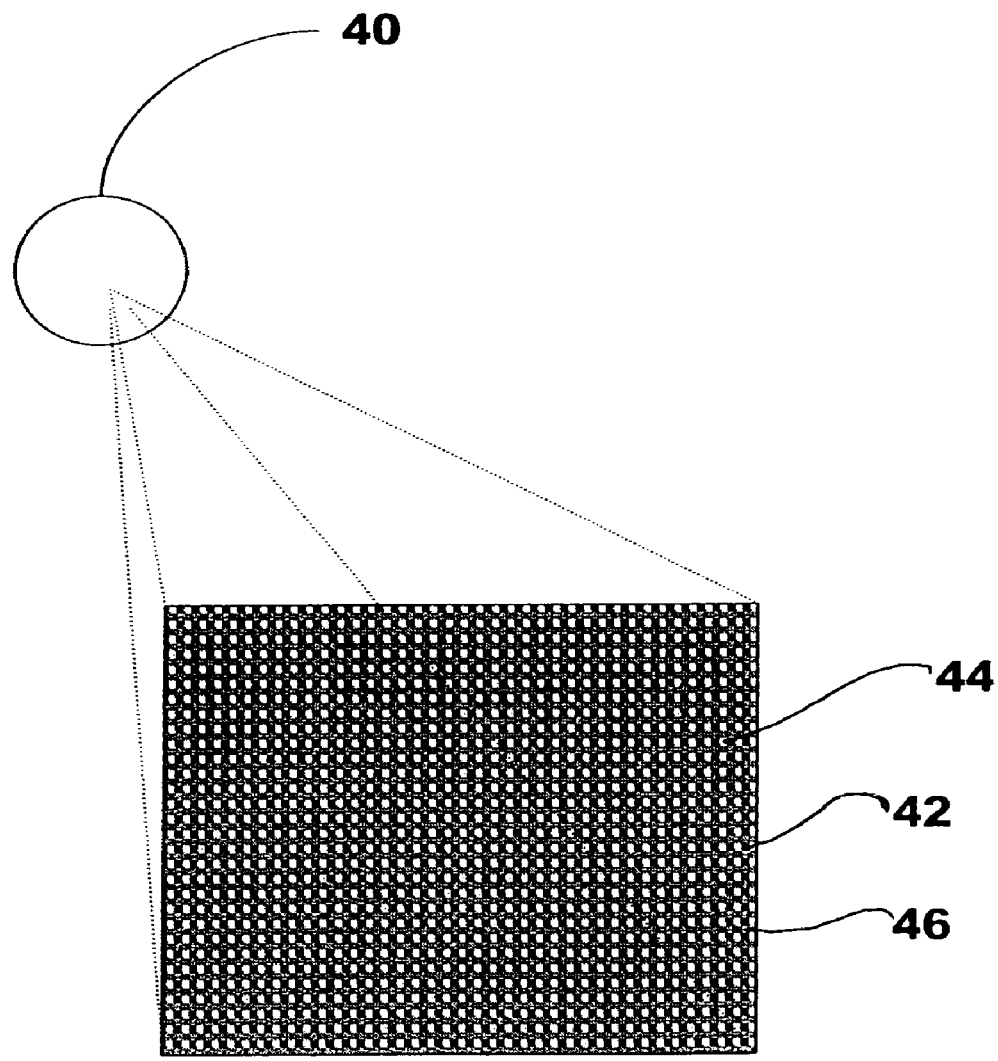
FIG. 4 is a schematic representation of a preferred embodiment integrated circuit including a UV detector array.

An exemplary integration is shown in FIG. 4. A silicon wafer 40 includes an integrated circuit. The wafer may also include a plurality of integrated circuits formed thereon.

Individual circuits formed on the wafer 40 may include, for example, memory, control circuitry, microprocessors, etc. A portion of one or many of the integrated circuits defined on the wafer includes an array of coated spherical silicon nanoparticle detectors 42 separated by patterned dielectric regions 44 that form device isolations and a circuit interconnect pattern 46, which may be a multi-level connection with interlevel dielectric layers positioned between. The wafer 40 will typically be diced to form small wafers, each typically including an individual integrated circuit. Wafer, as used herein, may therefore refer to either a silicon wafer formed with many separate integrated circuits or the subsequent small wafers each including one or more integrated circuits.

While a specific embodiment of the present invention has been shown and described, it should be understood that other modifications, substitutions and alternatives are apparent to one of ordinary skill in the art. Such modifications, substitutions and alternatives can be made without departing from the spirit and scope of the invention, which should be determined from the appended claims.

Various features of the invention are set forth in the appended claims.

What is claimed is:

1. A UV detector, comprising:
    a silicon substrate;
    dielectric defining a detection area;
    a UV detection thin film of coated spherical silicon nanoparticles formed in said detection area, said silicon nanoparticles having diameters being selected from the group of sizes consisting of 1 nm, 1.67 nm, 2.15 nm, 2.9 nm and 3.7 nm;
    a thin conductor upon said UV detection film, said thin conductor being thin enough to pass UV radiation; and
    a contact to said thin conductor.

2. The UV detector of claim 1, wherein said coated spherical silicon nanoparticles are coated with hydrogen.

3. The UV detector of claim 2, wherein said coated spherical silicon nanoparticles are 1 nm, having ~29 silicon atoms and a coating of ~24 hydrogen atoms.

4. The UV detector of claim 3, wherein said dielectric comprises $SiO_2$.

5. The UV detector of claim 1, wherein said silicon substrate comprises a silicon wafer contact that comprises part of a circuit interconnect pattern.

6. An integrated circuit including the UV detector of claim 1, the silicon substrate comprising a silicon wafer, further comprising a plurality of the UV detectors formed as an array on said silicon wafer, said dielectric comprising an interlevel dielectric and further comprising a multi-level circuit interconnect pattern connecting said array to other devices on said silicon wafer.

7. An integrated circuit including a UV detector array formed on a silicon wafer, each detector in the array comprising:
    a UV detection thin film of coated spherical silicon nanoparticles, said silicon nanoparticles having diameters being selected from the group of sizes consisting of 1 nm, 1.67 nm, 2.15 nm, 2.9 nm and 3.7 nm; and
    a thin conductor upon said UV detection film, said conductor being thin enough to pass UV radiation, the integrated circuit further comprising device isolations and an interconnection pattern including electrical contact to the UV detector array.

8. A UV detector, comprising:
    a substrate;
    a UV detection thin film of coated spherical silicon nanoparticles formed upon said substrate, said silicon nanoparticles having diameters being selected from the group of sizes consisting of 1 nm, 1.67 nm, 2.15 nm, 2.9 nm and 3.7 nm;
    means for electrically biasing said UV detection thin film while permitting UV radiation to reach said UV detection thin film.

9. A method for forming a UV detector, the method comprising steps of:
    bringing a silicon substrate into contact with a colloid including coated spherical silicon nanoparticles, said silicon nanoparticles having diameters being selected from the group of sizes consisting of 1 nm, 1.67 nm, 2.15 nm, 2.9 nm and 3.7 nm;
    depositing a UV detection film of the coated spherical silicon nanoparticles;
    forming a UV semi-transparent conducting film upon the UV detection film.

10. The method of claim 9, wherein said step of depositing comprises:
    biasing the substrate to deposit coated spherical silicon nanoparticles as a UV detection film on the silicon substrate; and
    separating the silicon substrate from the colloid.

11. The method of claim 10, wherein said silicon substrate comprises a device-quality silicon wafer.

12. The method of claim 11, further comprising, prior to said step of bringing, forming a mask upon the substrate to define an area for deposit of the UV detection film.

13. The method of claim 12, wherein said mask comprises a dielectric.

14. The method of claim 13, wherein said dielectric comprises $SiO_2$.

15. The method of claim 10, wherein said step of biasing comprises establishing a current flow in the range of ~50–200 µA.

* * * * *

UNITED STATES PATENT AND TRADEMARK OFFICE
CERTIFICATE OF CORRECTION

PATENT NO. : 6,992,298 B2
APPLICATION NO. : 10/374683
DATED : January 31, 2006
INVENTOR(S) : Nayfeh et al.

It is certified that error appears in the above-identified patent and that said Letters Patent is hereby corrected as shown below:

In the specification:

Col. 2, line 58, delete "2.15, 2.9 and" and insert --2.15 nm, 2.9 nm and-- therefor Signed and Sealed this Eighteenth Day of July, 2006

JON W. DUDAS
*Director of the United States Patent and Trademark Office*

UNITED STATES PATENT AND TRADEMARK OFFICE
Certificate

Patent No. 6,992,298 B2                                Patented: January 31, 2006

On petition requesting issuance of a certificate for correction of inventorship pursuant to 35 U.S.C. 256, it has been found that the above identified patent, through error and without any deceptive intent, improperly sets forth the inventorship.

Accordingly, it is hereby certified that the correct inventorship of this patent is: Munir H. Nayfeh, Urbana, IL (US); Osama M. Nayfeh, Cambridge, MA (US); Abdalla Al Dwayyan, Riyadh (SA); and Mohammad Al Salhi, Riyadh (SA).

Signed and Sealed this Third Day of January 2012.

<div style="text-align:right">

DAVID P. PORTA
*Supervisory Patent Examiner*
Art Unit 2884
Technology Center 2800

</div>